United States Patent [19]

McKinnon et al.

[11] Patent Number: 5,247,255
[45] Date of Patent: Sep. 21, 1993

[54] NUCLEAR MAGNETIC RESONANCE SPECTROSCOPY METHOD

[75] Inventors: Graeme McKinnon, Zürich; Peter Bösiger, Ennetbaden, both of Switzerland

[73] Assignee: U.S. Philips Corp., New York, N.Y.

[21] Appl. No.: 730,311

[22] Filed: Jul. 15, 1991

[30] Foreign Application Priority Data

Jul. 20, 1990 [DE] Fed. Rep. of Germany ....... 4023128

[51] Int. Cl.$^5$ ............................................ G01R 33/20
[52] U.S. Cl. ................................................... 324/309
[58] Field of Search .............. 324/300, 307, 309, 318, 324/322; 128/653.2, 653.5

[56] References Cited

U.S. PATENT DOCUMENTS 4,918,387  4/1990  McKinnon et al. ................ 324/309

FOREIGN PATENT DOCUMENTS 0322006  11/1988  European Pat. Off. .

OTHER PUBLICATIONS

G. C. McKinnon & P. Boesiger, "Magnetic Resonance in Medicine", vol. 8, pp. 355–161 (1988), entitled: Communication: A One-Shot Lactate-Editing Sequence for Localized Whole-Body Spectroscopy.

Magnetic Resonance in Medicine, vol. 9, No. 2, Feb. 1989 "Single Scan Volume Selective Spectral Editing by Homonuclear Polarization Transfer" Knuttel et al.

*Primary Examiner*—Michael J. Tokar
*Attorney, Agent, or Firm*—Jack D. Slobod

[57] ABSTRACT

A sequence acts—preferably several times—upon an examination region, which sequence comprises two frequency-selective high-frequency pulses not exciting the water component, between which a 180° high-frequency pulse is present. Such a sequence can be more insensitive to imperfections of the 180° pulse in that the second frequency-selective high-frequency pulse is followed by a further frequency-selective high-frequency pulse not exciting the water component and in that between the second frequency-selective high frequency pulse and the further high-frequency pulse as well as after the further high-frequency pulse a magnetic gradient field is switched on and off in such a manner that the time integrals across this gradient field before and after the further high-frequency pulse are equal to each other.

16 Claims, 3 Drawing Sheets

NUCLEAR MAGNETIC RESONANCE SPECTROSCOPY METHOD

FIELD OF THE INVENTION

The invention relates to a nuclear magnetic resonance spectroscopy method, in which a sequence acts—preferably several times—upon an examination region, which sequence comprises two frequency-selective high-frequency pulses, which do not excite the water component and between which a 180° high-frequency pulse is present, as well as to an arrangement for carrying out such a method. Of interest is commonly owned copending application Ser. No. 489,408 filed Mar. 5, 1990 entitled Nuclear Spin Examination Method and Arrangement for Carrying Out the Method in the name of D. J. Holz.

BACKGROUND OF THE INVENTION

Such a method is known from EP-A 322 006 which corresponds to U.S. Pat. No. 4,918,387 and from the magazine "Magnetic Resonance in Medicine" 8, 355-361 (1988). In dependence upon the phase position of the second frequency-selective high-frequency pulse, by means of the known method either lactic acid (lactate) or fat (lipids) can be demonstrated in an examination region containing water besides fat and lactic acid.

The 180° high-frequency pulse is then a so-called hard pulse, whose frequency spectrum includes the Lamor frequency of water. In the ideal case—if this pulse triggers the nuclear magnetization each time everywhere through 180°—the nuclear magnetization of protons bound to water in the examination region is not excited thereby. In practice and more particularly in examinations at the living body, however, small deviations from this angle are obtained, which on account of the comparatively high water concentration in the human body impede the demonstration of the lactate or lipid components or even make this demonstration completely impossible.

It is known for suppressing the disturbing water components to invert in every second sequence the phase position of 180° pulse—related to the first frequency-selective pulse. Thus, the sign of the component contained in the nuclear magnetic resonance signal and leading back to the water is inverted from sequence to sequence so that these components compensate each other after a summation of the nuclear magnetic resonance signals. However, this method is sensitive to movements in the examination region, such as may occur during the spectroscopic examination at the human body.

SUMMARY OF THE INVENTION

The present invention has for its object to carry out the method mentioned in the opening paragraph in a different manner so that in spite of the presence of water in the examination region the spectroscopic demonstration of lactate or lipids is possible.

According to the invention, this object is achieved in that the second frequency-selective high-frequency pulse is followed by a further frequency-selective high-frequency pulse not exciting the water component and in that between the second frequency-selective high-frequency pulse and the further high-frequency pulse as well as after the further high-frequency pulse a magnetic gradient field is switched on and off in such a manner that the time integrals across this gradient field before and after the further high-frequency pulse are equal to each other.

The further high-frequency pulse in conjunction with the magnetic gradient field before and after this pulse has a different effect on the nuclear magnetization of the protons bound to water on the one hand and on that of the protons bound to lactic acid or fat on the other hand. The protons bound to water do not "see" this pulse and therefore their nuclear magnetization—in case it was excited by the 180° pulse—is dephased so that it cannot contribute to the nuclear magnetic resonance signal from the examination region. However, since the further high-frequency pulse has frequency components having the Lamor frequency of the protons bound to lactic acid or fat, it acts together with the preceding and the following magnetic gradient field as a refocusing pulse, that is to say that the dephasing experienced by the nuclear magnetization of these protons before the further pulse, is eliminated by the rephasing, which they experience after this pulse. In the result, the further high-frequency pulse leads in conjunction with the magnetic gradient field therefore to a "water suppression".

A further embodiment of the invention is characterized in that the further high-frequency pulse is a 180° pulse. Although the pulse may also have a flip angle different from 180°, the largest amplitude of the nuclear magnetic resonance signal (originating from lactic acid or fat) is obtained at 180°.

A further embodiment of the invention is characterized in that the further frequency-selective high-frequency pulse is followed by three 180° high-frequency pulses in the presence of each time a magnetic gradient field and in that the gradients of the magnetic gradient fields active during these 180° high-frequency pulses are perpendicular to each other. Thus, it is possible to select a given volume and to determine the content of lipids or lactate only for this volume (localized spectroscopy).

An arrangement for carrying out the method according to the invention, which is provided with means for producing a homogeneous stationary magnetic field, with a high-frequency coil arrangement for producing high-frequency pulses and for recording the nuclear magnetic resonance signals produced in response thereto in the examination region, with a processing unit for deriving a spectrum from the recorded nuclear magnetic resonance signals and with a control unit, is characterized in that the control unit is constructed so that it produces at least one sequence, in which a first frequency-selective 90° high-frequency pulse is followed for water suppression by a 180° pulse, which is followed in turn by a second frequency-selective 90° high-frequency pulse for water suppression, whereupon a magnetic gradient field is switched on and off, after which a further frequency-selective high-frequency pulse follows and then the magnetic gradient field is again switched on and off.

BRIEF DESCRIPTION OF THE DRAWING

The invention will now be described more fully with reference to the accompanying drawing, in which.

DESCRIPTION OF THE PREFERRED EMBODIMENT

Figure 1:
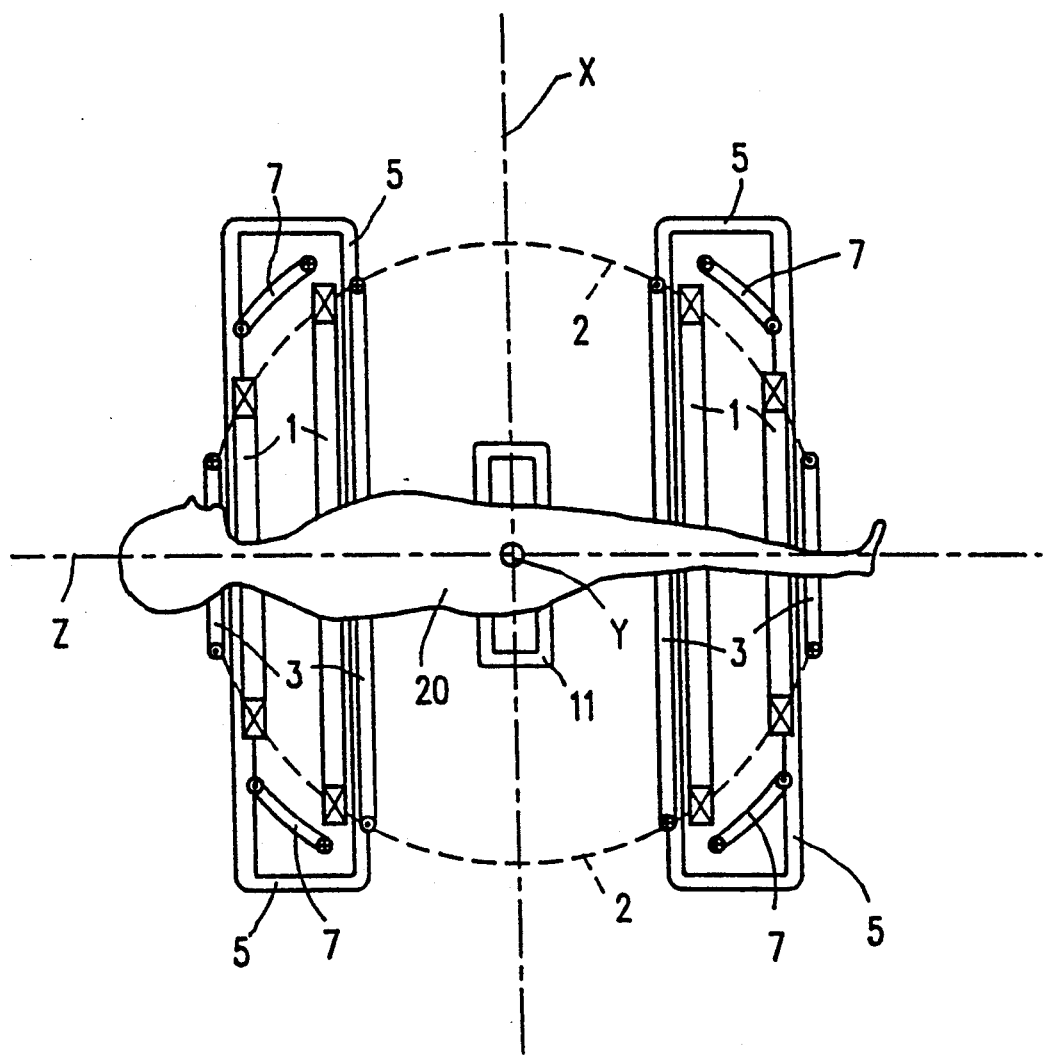
FIG. 1 shows an apparatus for medical nuclear magnetic resonance examinations, by which the method according to the invention can be carried out.

The nuclear magnetic resonance examination apparatus shown diagrammatically in FIG. 1 comprises an arrangement consisting of four coils 1 for producing a homogeneous stationary magnetic field, which can be of the order of a few tenths of T to a few T. This field extends in the z direction of a Cartesian coordinate system. The coils arranged concentrically to the z axis can be arranged on a spherical surface 2. The patient 20 to be examined is situated in the interior of these coils.

For producing a magnetic field Gz extending in the z direction and varying linearly in this direction, four coils 3 are arranged preferably on the same spherical surface. Further, four coils 7 are provided, which produce a gradient field Gx (i.e. a magnetic field, whose strength varies linearly in one direction), whose gradient extends in the x direction however. A magnetic gradient field Gy extending in the z direction and having a gradient in the y direction is produced by four coils 5, which may take the same form as the coils 7, but which are arranged so as to be offset by 90° with respect to the latter. FIG. 1 shows only two of these four coils. Coil arrangements 3, 5, and 7 for producing the magnetic gradient fields Gz, Gy and Gx, respectively, are supplied by current generators 23, 25 and 27 with a current whose temporal variation can be controlled by the control unit 15.

Since each of the three coil arrangements 3, 5 and 7 for producing the magnetic gradient fields Gz, Gy and Gx, respectively, is arranged symmetrically to the spherical surface 2, the field strength at the center of the sphere, which constitutes at the same time the origin of the coordinates of the Cartesian xyz coordinate system, is determined only by the stationary homogeneous magnetic field of the coil arrangement 1. Further, a high-frequency coil 11 is arranged symmetrically to the plane $z=0$ of the coordinate system, which is constructed so that a substantially homogeneous high-frequency magnetic field extending in the x direction, i.e. at right angles to the direction of the stationary homogeneous magnetic field, is thus produced. A high-frequency modulated current is supplied by a high-frequency generator to the high-frequency coil during each high-frequency pulse. After a sequence, the high-frequency coil 11 or a separate high-frequency reception coil serves to receive the nuclear magnetic resonance signals produced in the examination region.

Figure 2:
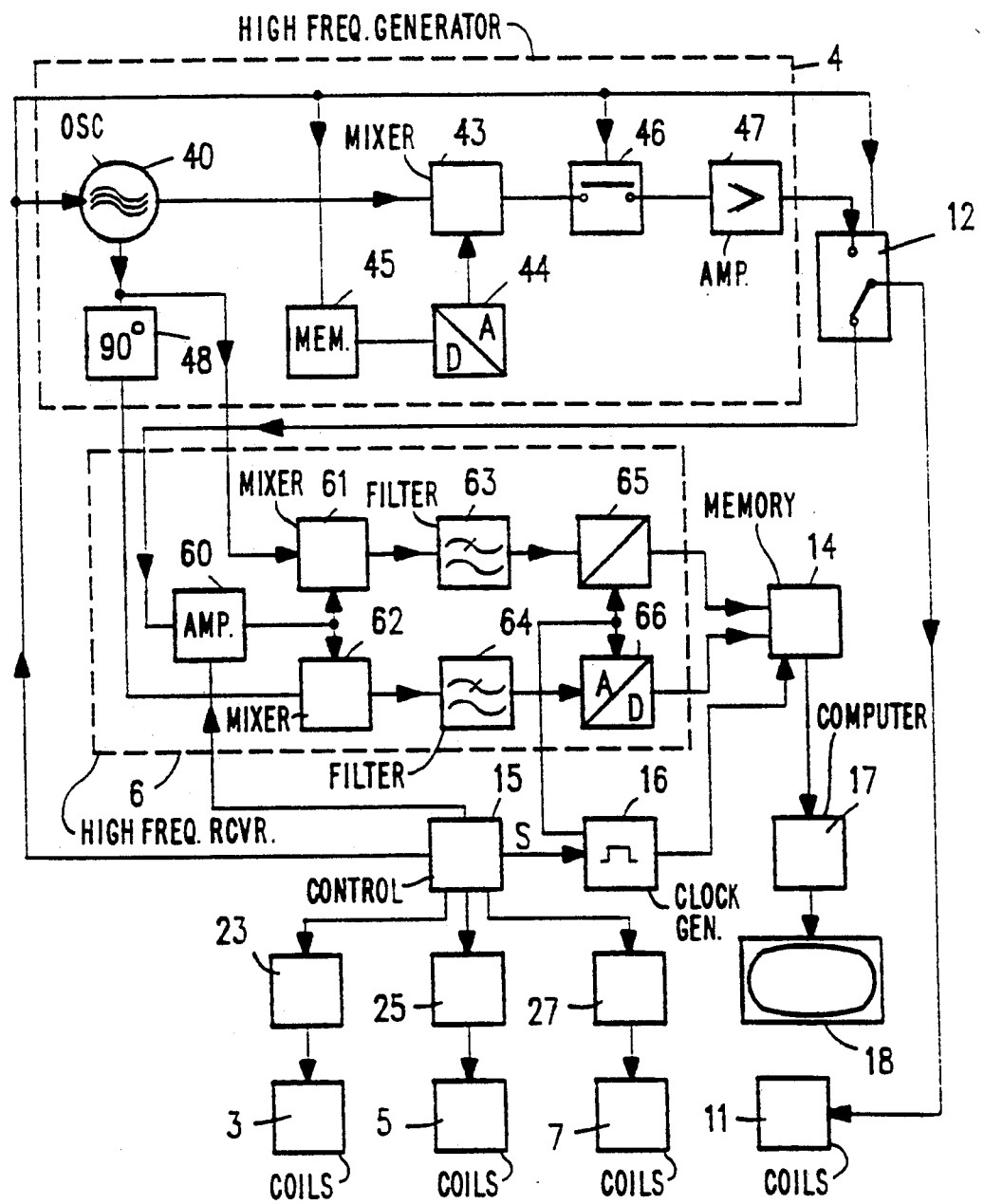
FIG. 2 shows a block circuit diagram of such an apparatus.

FIG. 2 shows a simplified block circuit diagram of this nuclear magnetic resonance examination apparatus. The high-frequency coil 11 is connected through a change-over device 12 on the one hand to a high-frequency generator 4 and on the other hand to a high-frequency receiver 6.

The high-frequency generator 4 comprises a high-frequency oscillator 40, whose frequency can be digitally controlled by a control unit 15 and which supplies oscillations having a frequency corresponding to the Lamor frequency of the atomic nuclei to be excited at the field strength produced by the coils 1. The Lamor frequency f is calculated, as is known, according to the relation $f=cB$, where B is the magnetic induction in the stationary homogeneous magnetic field and c is the gyromagnetic ratio, which is, for example, for protons 42.56 MHz/T. The output of the oscillator 40 is connected to an input of a mixer stage 43. A second input signal is supplied to the mixer stage by a digital-to-analog converter 44, whose output is connected to a digital memory 45. Under the control of the control device, a sequence of digital data words representing an envelope signal is read out of the memory.

The mixer stage 43 processes the input signals supplied to it in such a manner that the carrier oscillation modulated by the envelope signal appears at its output. The output signal of the mixer stage 43 is supplied through a switch 46 controlled by the control device 15 to a high-frequency power amplifier 47, whose output is connected to the change-over device 12. The latter is also controlled by the control device 15.

The receiver 6 comprises a high-frequency amplifier 60, which is connected to the change-over device and to which the nuclear magnetic resonance signals induced in the high-frequency coil 11 are supplied, while the change-over device must be in the corresponding switching state. The amplifier 60 has a muting input, which is controlled by the control device 15 and through which it can be blocked so that the amplification is practically zero. The output of the amplifier is connected to the first inputs of two multiplicative mixer stages 61 and 62, which each time supply an output signal corresponding to the product of their input signals. A signal having the frequency of the oscillator 40 is supplied to the second inputs of the mixer stages 61 and 62, while a phase shift of 90° occurs between the signals at the two inputs. This phase shift is produced by means of a 90° phase shift member 48, whose output is connected to the input of the mixer stage 62 and whose input is connected to the input of the mixer stage 61 and to the output of the oscillator 40.

The output signals of the mixer stages 61 and 62 are each supplied to an analog-to-digital converter 65 and 66, respectively, through low-pass filters 63 and 64, which suppress the frequency delivered by the oscillator 40 and all frequencies lying above it and transmit low-frequency components. This converter converts the analog signals of the circuit 61 . . . 64 constituting a quadrature demodulator into digital data words, which are supplied to a memory 14. The analog-to-digital converters 65 and 66 as well as the memory 14 receive their clock pulses from a clock pulse generator 16, which can be blocked and released, respectively, through a control lead by the control device 15 so that only in a measuring interval defined by the control device 15 the signals delivered by the high-frequency coil 11 and transposed to the low-frequency range can be converted into a sequence of digital data words and can be stored in the memory 14.

The data words stored in the memory 14 are supplied to a computer 17, which determines therefrom by a discrete Fourier transformation the spectrum of the nuclear magnetization and displays it at a suitable display unit, for example a monitor 18.

Figure 3:
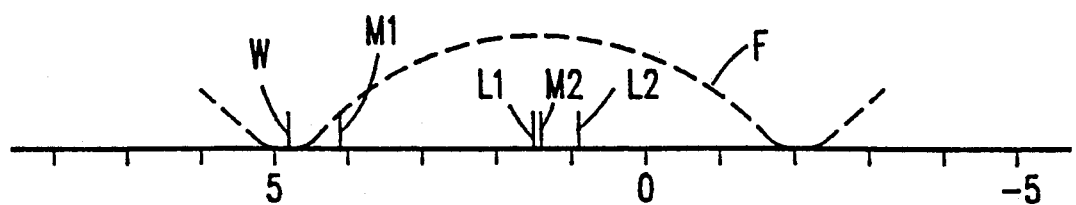
FIG. 3 shows the position of the spectral components of water, lactic acid and lipids.

FIG. 3 shows the position of the components essential to the spectroscopic examination on a frequency scale indicating the frequency deviation standardized on the Lamor frequency of TMS (tetramethyl silane) with respect to the Lamor frequency of TMS. The Lamor frequency of TMS therefore lies at zero, while the Lamor frequency W of water lies at 4.7 ppm. Lactic acid contains a line M2 at about 1.3 ppm, which originates from the $CH_3$ group of lactate. This $CH_3$ group is coupled scalarly with a CH group of the lactic acid molecule, whose Lamor frequency M1 lies at 4.1 ppm. In the immediate proximity of the component M2, a line L1 is situated (at about 1.4 ppm), which originates from a $CH_2$ group of the fat molecule, which is coupled with a $CH_3$ group of this molecule at about 0.9 ppm. In the proximity of the line M2, there are still further uncoupled lines of the lipid frequency spectrum, which are not shown further in FIG. 3.

FIG. 3 indicates diagrammatically in addition by a broken line F the frequency spectrum of a binomial high-frequency pulse. Such high-frequency pulses are used as frequency-selective pulses in the method described more fully with reference to FIG. 4. It can be seen that the frequency components of these pulses have the value zero at the water line W and have their maximum approximately at the line M2 of lactic acid. Consequently, the nuclear magnetization of water—in fact not that of the lactic acid component M1—is excited thereby, but the lactic acid component M2, the coupled lipid components L1 and L2 and the remaining lipid components in this frequency range not shown in FIG. 3 are indeed excited.

Figure 4:
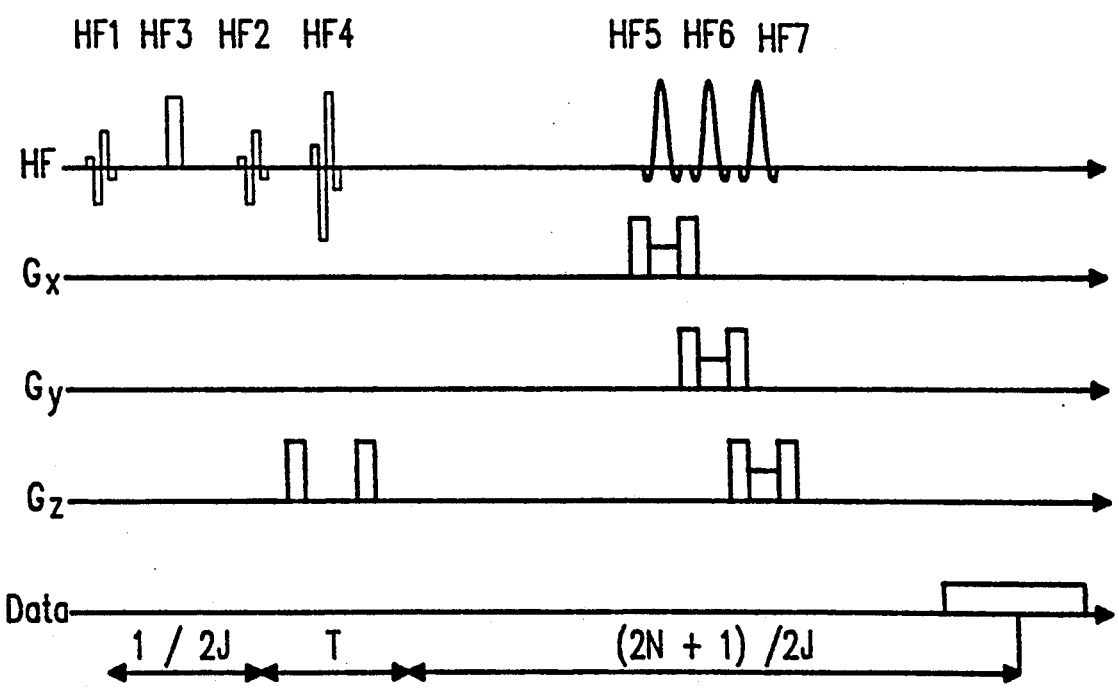
FIG. 4 shows the variation with time of a sequence according to the invention for localized spectroscopy.

According to FIG. 4, the variation with time of the signals is shown in a sequence, which is suitable for the localized spectroscopy, inter alia at the area of the human heart. The sequence is repeated sufficiently frequently to obtain a sufficient signal-to-noise ratio. The sequence begins with a frequency-selective 90° high-frequency pulse HF1, a binomial (1331) pulse (first line). Such a binomial high-frequency pulse consists, as is known, of a sequence of subpulses, whose assigned flip angles are in the same ratio to each other as the binomial coefficients. The time interval between the subpulses and the frequency of the carrier oscillation active within the subpulses are proportioned so that the frequency spectrum of the binomial high-frequency pulse disappears at the Lamor frequency W of water and has its maximum at least approximately at the Lamor frequency M2 of lactate.

The high-frequency pulse HF2, whose centre is at a distance $\frac{1}{2}$ J from the centre of the pulse HF1, J being the scalar coupling constant of lactic acid (about 7 Hz), has the same variation with time as HF1—if once the phase position of the carrier oscillation is left out of consideration. Between these two high-frequency pulses, the sequence comprises a hard (broadband) 180° high-frequency pulse HF3. The carrier oscillation active during the high-frequency pulse HF3 must have the same phase position as or the phase position opposite to that during the first and third subpulses, respectively, of HF1. If HF2 has the same phase position as HF1, all components except M2 are suppressed so that lactate can be demonstrated. If the phase position of HF2 is offset by 90° with respect to that of HF1, however, M2 as well as the coupled lipid components L1, L2 are suppressed so that a demonstration of the uncoupled lipid components L1, L2 is possible. This is described in detail in the publications mentioned hereinbefore.

According to the invention, after the high-frequency pulse HF2 a still further frequency-selective high-frequency pulse HF4 is produced, whose spectrum disappears at the water line W and has its maximum at M2—in accordance with curve F in FIG. 3. However, HF1 and HF2 being active as 90° pulses, HF4 is preferably a 180° high-frequency pulse, for example in the form of a binomial (2662)* pulse. Between the high-frequency pulses HF2 and HF4 as well as after HF4, a magnetic gradient field is switched on and off—in this case the field Gz. The value of the gradient and the variation with time are chosen so that the time integral across Gz before HF4 is equally large as after HF4.

The protons bound to water and excited partly by the imperfection of the 180° pulse HF3 do not "see" the pulse HF4 on account of its frequency selectivity so that they are acted upon only by the gradient field Gz, which dephases them. For the components L1, L2, M2 and the remaining components in this frequency range, on the contrary, HF4 acts as a refocusing pulse so that the dephasing experienced by these components due to the gradient field Gz before the pulse HF4 is compensated again by the corresponding rephasing due to the field Gz active after HF4. Altogether, the components L1, M2 etc. are practically not influenced by HF4 in conjunction with the gradient field Gz before and after this pulse, while the water components excited particularly by HF3 are dephased thereby. The consequences of the undesired water excitation by HF3 are therefore not so serious as in a sequence without HF4 and Gz.

In order that lactate and lipids can be demonstrated only in a subvolume of the examination region limited on all sides, the sequence comprises after the high-frequency pulse HF4 three 180° high-frequency pulses HF5, HF6 and HF7, which each are accompanied by a magnetic gradient field Gx, Gy and Gz (second, third and fourth line of FIG. 4), whose gradients extend at right angles to each other. The demonstration is consequently limited to a subvolume, whose position and size are determined by the frequency of these pulses, their bandwidth and the strength of the gradient. Before and after the pulses HF5 . . . HF7, the gradient fields Gx, Gy and Gz are preferably active with an enlarged amplitude and with such a variation with time that the time integral across the magnetic gradient field as far as the centre of the assigned pulse is accurately equally large as the time integral across the gradient field after this instant. The variation with time of the gradient fields Gx . . . Gz does not influence the nuclear magnetization within the selected subvolume, but it influences the nuclear magnetization in the examination region located outside the subvolume, this magnetization being dephased thereby.

The high-frequency pulse HF4 and the gradient field Gz extending symmetrically in time thereto are produced in the middle of a time interval T, which begins at the centre of the high-frequency pulse HF2. The nuclear magnetic resonance signal developing in the selected subvolume is scanned according to the fifth line of FIG. 4 in a time interval whose middle is at a distance in time (2N+1)/2J from the end of the time interval T, where N is an integer, preferably 0 or 1. In the aforementioned scanning interval, the clock generator 16 is released so that the digitized nuclear magnetic resonance signal transposed to the low-frequency range can be subjected in the computer 17 to a discrete Fourier transformation, preferably after the nuclear magnetic resonance signals recorded in the scanning interval after frequent repetition of the sequence described have been summated.

In the present embodiment, binomial high-frequency pulses were used as frequency-selective high-frequency pulses, but other frequency-selective pulses may also be used for example the so-called DANTE pulses. The angle by which the nuclear magnetization of the components M2 or L1 etc. is triggered by the high-frequency pulse need not necessarily be 180°; it may also be smaller, but in this case the amplitude of the nuclear magnetic resonance signals also decreases.

What is claimed is:

1. A nuclear magnetic resonance spectroscopy method, in which a sequence acts several times upon an examination region, which sequence comprises two frequency-selective high-frequency pulses (HF1, HF2), between which a 180° high-frequency pulse is present, and a further frequency-selective high-frequency pulse (HF4) following a second pulse (HF2) of the two frequency-selective high-frequency pulses (HF1, HF2), said two frequency-selective pulses and said further frequency-selective pulse not exciting a water component, wherein between the second frequency-selective high-frequency pulse (HF2) and the further high-frequency frequency-selective pulse (HF4) a magnetic gradient field (Gz) is switched on and off in such a manner that integrals of this gradient field over time before and after the further high-frequency pulse (HF4) are equal to each other.

2. A method as claimed in claim 1, wherein the further high-frequency pulse (HF4) is a 180° pulse.

3. A method as claimed in claim 1 wherein the further frequency-selective high-frequency pulse is a binominal high-frequency pulse (HF4).

4. A method as claimed in claim 1, wherein the further frequency-selective high-frequency pulse is followed by three further 180° high-frequency pulses (HF5, HF6, HF7) in the presence of respective magnetic gradient fields having different gradients, the gradients (Gx, Gy, Gz) of the respective magnetic gradient fields present during these three further 180° high-frequency pulses being mutually perpendicular.

5. An arrangement for carrying out nuclear magnetic resonance spectroscopy, comprising means for producing a homogeneous stationary magnetic field in an examination region, gradient coil means for producing selected gradient magnetic fields in said examination region, a high-frequency coil means for transmitting high-frequency pulses into the examination region and for receiving nuclear magnetic resonance signals from the examination region, processing means for deriving a spectrum from the received nuclear magnetic resonance signals, and control means for controlling said high-frequency coil means and said gradient coil means in a manner to produce at least one sequence, in which a first frequency-selective 90° high-frequency pulse (HF1) for water suppression is followed by a 180° high-frequency pulse (HF3), which is followed in turn by a second frequency-selective 90° high-frequency pulse (HF2) for water suppression, whereupon a magnetic gradient field (Gz) is switched on and off, after which a further frequency-selective high-frequency pulse (HF4) follows and then the magnetic gradient field (Gz) is again switched on and off.

6. A method as claimed in claim 2 wherein the further frequency-selective high-frequency pulse is a binominal high-frequency pulse (HF4).

7. A method as claimed in claim 3, wherein the further frequency-selective high-frequency pulse is followed by three further 180° high-frequency pulses (HF5, HF6, HF7) in the presence of respective magnetic gradient fields having different gradients, the gradients (Gx, Gy, Gz) of the respective magnetic gradient fields present during these three further 180° high-frequency pulses being mutually perpendicular.

8. A method as claimed in claim 6, wherein the further frequency-selective high-frequency pulse is followed by three further 180° high-frequency pulses (HF5, HF6, HF7) in the presence of respective magnetic gradient fields having different gradients, the gradients (Gx, Gy, Gz) of the respective magnetic gradient fields present during these three further 180° high-frequency pulses being mutually perpendicular.

9. A method as claimed in claim 2, wherein the further frequency-selective high-frequency pulse is followed by three further 180° high-frequency pulses (HF5, HF6, HF7) in the presence of respective magnetic gradient fields having different gradients, the gradients (Gx, Gy, Gz) of the respective magnetic gradient fields present during these three further 180° high-frequency pulses being mutually perpendicular.

10. An arrangement as claimed in claim 5, wherein the further frequency-selective high-frequency pulse (HF4) is a 180° pulse.

11. An arrangement as claimed in claim 5, wherein the further frequency-selective high-frequency pulse (HF4) is a binomial pulse.

12. An arrangement as claimed in claim 10, wherein the further frequency-selective high-frequency pulse (HF4) is a binomial pulse.

13. An arrangement as claimed in claim 5, wherein the further frequency-selective high-frequency pulse is followed by three further 180° high-frequency pulses (HF5, HF6, HF7) in the presence of respective magnetic gradient fields having different gradients, the gradients (Gx, Gy, Gz) of the respective magnetic gradient fields present during these three further 180° high-frequency pulses being mutually perpendicular.

14. An arrangement as claimed in claim 10, wherein the further frequency-selective high-frequency pulse is followed by three further 180° high-frequency pulses (HF5, HF6, HF7) in the presence of respective magnetic gradient fields having different gradients, the gradients (Gx, Gy, Gz) of the respective magnetic gradient fields present during these three further 180° high-frequency pulses being mutually perpendicular.

15. An arrangement as claimed in claim 11, wherein the further frequency-selective high-frequency pulse is followed by three further 180° high-frequency pulses (HF5, HF6, HF7) in the presence of respective magnetic gradient fields having different gradients, the gradients (Gx, Gy, Gz) of the respective magnetic gradient fields present during these three further 180° high-frequency pulses being mutually perpendicular.

16. An arrangement as claimed in claim 12, wherein the further frequency-selective high-frequency pulse is followed by three further 180° high-frequency pulses (HF5, HF6, HF7) in the presence of respective magnetic gradient fields having different gradients, the gradients (Gx, Gy, Gz) of the respective magnetic gradient fields present during these three further 180° high-frequency pulses being mutually perpendicular.

* * * * *